United States Patent [19]

Voboril et al.

[11] 3,989,095
[45] Nov. 2, 1976

[54] SEMI CONDUCTOR COOLING SYSTEM

[75] Inventors: Bohuslav Voboril; Pavel Reichel; Pavel Kafunek, all of Prague, Czechoslovakia

[73] Assignee: CKD PRAHA, oborovy podnik, Prague, Czechoslovakia

[22] Filed: July 17, 1975

[21] Appl. No.: 596,588

Related U.S. Application Data

[62] Division of Ser. No. 427,225, Dec. 21, 1973.

[30] Foreign Application Priority Data

Dec. 28, 1972 Czechoslovakia .................. 9004/72

[52] U.S. Cl. .................................. 165/1; 165/105; 357/82; 174/15 HP
[51] Int. Cl.² ........................................ H01L 23/40
[58] Field of Search .............. 165/105, 1, 133, 80; 357/82; 174/15 HP

[56] References Cited
UNITED STATES PATENTS

| | | | |
|---|---|---|---|
| 3,649,738 | 3/1972 | Anderson et al. ............... | 357/81 X |
| 3,673,306 | 6/1972 | Kirkpatrick ...................... | 174/15 R |
| 3,739,234 | 6/1973 | Bylund et al. ................... | 165/105 X |
| 3,739,235 | 6/1973 | Kessler, Jr. ..................... | 174/15 R X |
| 3,786,168 | 1/1974 | Jaecklin et al. .................. | 174/15 R |
| 3,826,957 | 7/1974 | McLaughlin et al. ............ | 165/105 X |
| 3,834,454 | 9/1974 | Gammel et al. ................. | 165/105 X |

Primary Examiner—A. W. Davis, Jr.

[57] ABSTRACT

A semi-conductor cooling system formed of a container having a wall portion made of soft yieldable material which is adapted to contact the surface of a semi-conductor device. A porous member is disposed within the container adjacent the inner surface of the yieldable wall. A liquid medium partially fills the remainder of the chamber immersing at least a portion of the porous member. The latent heat of the semi-conductor device is dissipated via the porous member in a closed evaporator-condensing cycle.

3 Claims, 2 Drawing Figures

SEMI CONDUCTOR COOLING SYSTEM

This is a divisional application of Ser. No. 427,225, filed Dec. 21, 1973.

BACKGROUND OF THE INVENTION

The present invention relates to a cooling system for solid state power devices and in particular to heat sink apparatus for power semi-conductor devices.

Semi-conductor power elements, for example, the silicon type, produce large quantities of heat during their operation and the problem of safely dissipating this heat is of critical concern. In general semi-conductor power elements are sandwiched between opposing rigid heat sinks of suitable material having good thermal conductivity, such as for example, copper or aluminum members. The semi-conductor, commonly a wafer, is sandwiched between a pair of such members which are clamped together by external spring means so as to apply a high degree of pressure evenly over the entire surface area of the wafer. This pressurized contact attempts to achieve and maintain low electrical and thermal contact resistance and acts to conduct heat away from the semi-conductor. The heat sink formed by the copper or aluminum member is usually provided with cooling fins which enables enlargement of the area cooled and an enlarged radiating surface over which the flow of air may be provided.

It has also been well known to provide heat sinks with a plurality of cooling fluid ducts disposed immediately adjacent to the surface of the semi-conductor wafer sandwiched between the heat sink members. In this way a liquid coolant passing through the ducts may be effectively used to cool the wafer.

The heat sinks of the kind heretofore described usually occupy a large amount of space and employ rather critical material. Accordingly, they are relatively expensive to manufacture and are large and heavy in use. In those heat sinks employing liquid coolant a difficulty arises from the necessity of electrically insulating the liquid coolant medium from the semi-conductor wafer, because of the high operating voltages placed on the semi-conductor itself.

Recently an entirely new technique has been involved for cooling semi-conductor elements employing the principle of a heat pipe. A mass flow of liquid is achieved inside a closed container by means of capillary action, the heat being transferred from one point to another in the form of latent heat of vaporization. The containers holding the mass of liquid is usually spaced in a housing body forming the heat sink which body is in pressure contact with the flat surface of a wafer packaged semi-conductor device. The known heat pipe cooling systems suffer from the disadvantage that the capillary structure is disposed over the prevailing or entire internal area of the container. This causes a significant decrease in the transfer of thermal energy. Another limiting factor exists in that the complexity of the shape of the container holding the liquid precludes the use of the most suitable porous materials.

It is an object of the present invention to provide an improved cooling system for semi-conductor devices which overcome the disadvantages and defects of the known prior art.

It is another object of the present invention to provide an improved cooling system and/or heat sink for wafer type semi-conductor devices which employes a closed evaporating-condensing cycle for transporting heat from the heat source to the heat sink.

It is still another object of the present invention to employ an improved cooling system for semi-conductor devices employing a capillary structure for the return of the condensate in the evaporating-condensing cycle.

It is a further object of the present invention to provide an improved cooling system operating on a closed evaporating-condensing cycle which is simple in construction, inexpensive and light in weight.

The foregoing objects, together with other objects and numerous advantages will be apparent from the following disclosure of the preferred form of the present invention.

SUMMARY OF THE INVENTION

According to the present invention, there is provided a cooling system for a semi-conductor device of the wafer type comprising an enclosed container forming an interior chamber. A wall portion of the container is formed of yieldably soft material adapted to contact against a surface of the semi-conductor device. A porous member is disposed within the chamber adjacent the inner surface of the yieldable wall. A liquid medium partially fills the remainder of the chamber and immerses at least a portion of the porous member. The heat produced by the semi-conductor device is transferred via the yieldable wall to the porous member wherein the latent heat causes the liquid to vaporize, the vapors thereafter condensing on the walls of the container and returning in drops to the liquid mass, which of course is absorbed by the porous member.

Preferably, at least the wall portion of the yieldable soft material is made of highly thermal conductive material. Also resilient means are provided biasing the porous member against the yieldable wall so that complete low resistance contact is made.

It is also preferred that the container be provided with external means for securing the yieldable wall in firm pressure contact with the semi-conductor device so that extremely low resistance thermal contact is made. In this form the use of material which is also of high electrical conductivity enables the yieldable wall to be also used as the terminal for the semi-conductor device.

Full details of the present invention are given in the following description of the generic form of the present invention as well as a particularly advantageous specific embodiment. In the following disclosure reference is made to the accompanying drawings.

DESCRIPTION OF THE INVENTION

Figure 1:
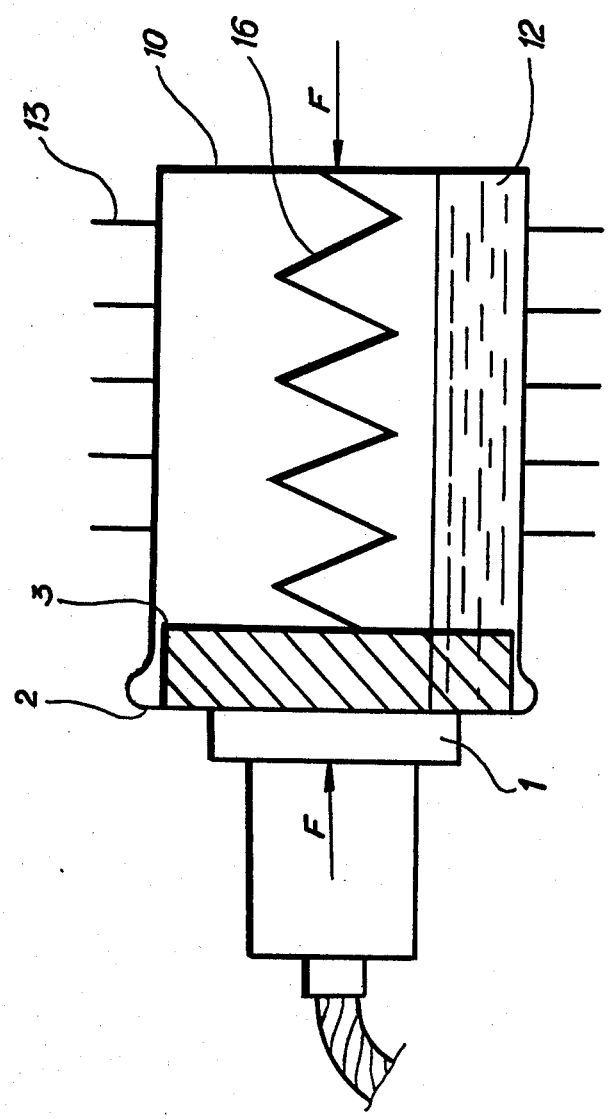
FIG. 1 is a schematic longitudinal cross section of the cooling apparatus employing the system of the present invention for the single-sided cooling of a conventional semi-conductor device.

The general features of the cooling system according to the present invention and the apparatus in which the system can be embodied is seen schematically in FIG. 1. Reference to the structure of the apparatus will make the system abundantly clear. Such apparatus comprises a hermetically sealed container 10 of any suitable shape forming an internal open chamber. The container 10 is abutted against a face of the semi-conductor device 1 under a force F which ensures a firm contact therebetween. The wall portion 2 of the container which abuts against the semi-conductor device 1 is made of soft, yieldable highly thermal conductive material, such as aluminum, copper or the like. A porous member 3 made of ceramic, plastic or the like, is located within the container 10 abutting against the inner surface of the contacting wall 2. The porous member 3 is at least partially immersed in a liquid coolant 12 which does not completely fill the container 10. A spring 16 or other pressure means acts on the porous member 3 so as to ensure its firm flat contact with the inner surface of the contacting wall 2. The outer surface of the container 10 is provided with a plurality of radiating cooling fins 13 of suitably desirable convective design. The semi-conductor device 1 is of conventional type and is provided with a terminal abutting one face and requires only single sided cooling.

Figure 2:
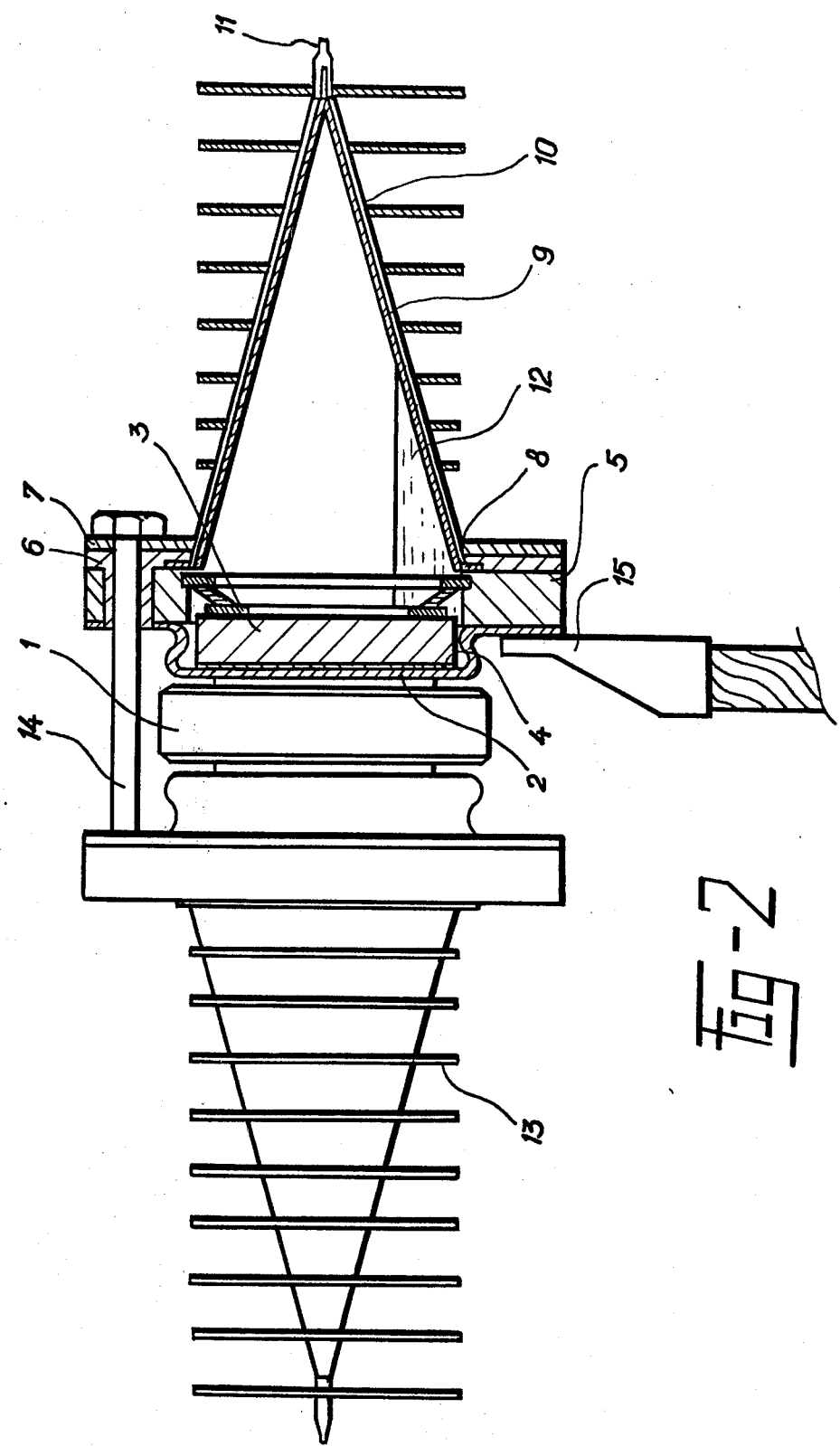
FIG. 2 is a longitudinal cross section of apparati employing the system of the present invention for the double sided cooling of a disc or wafer type semi-conductor device.

In the embodiment shown in FIG. 2 a more specific form of cooling system is shown for a disc cell semi-conductor device 1 requiring double sided cooling. Here, the container 10 may take the form of a conical hollow body, the exterior surface of which is provided with a plurality of fins of uniform diameter. The soft yieldable wall 2, formed for instance of copper, is joined about its external circumference with a rigid hard ring 5 formed for example of steel. Preferably the wall 2 is brazed or welded about its entire circumference to the ring 5. The rigid ring 5 is further welded or otherwise secured to the edge of the container 10 which is provided with a radially extending flange which thus seals the interior chamber formed by the container 10 and the soft yieldable wall 2. The apex of the container 10 is provided with an inlet-outlet duct 11 enabling liquid coolant to be introduced into the chamber thus formed. After the liquid coolant is introduced, the enclosed chamber is evacuated to a predetermined vacuum and hermetically sealed by closing the duct 11 with a cap or weld in conventional manner.

The porous member 3 is inserted within the chamber adjacent the inner surface of the soft yieldable wall 2. The disc porous member is biased and pressed against the wall 2 by a spring 8 such as a belleville spring fixed and secured in the rigid ring 5. Preferably the porous member 3 is made of ceramic or similar porous material allowing absorption of the liquid 12 and having relatively high thermal conductivity but an extremely low or non-existant electrical conductivity. If preferred, a layer 4 of material such as a metal foil, amalgam, or contact vaseline may be interposed between the porous member 3 and the inner surface of the soft yieldable 2 in order to improve the heat transfer therethrough.

The amount of liquid medium 12 introduced into the container 10 is sufficient at least to partially immerse the porous member 3 but not sufficient to completely fill the container. Preferably the amount of liquid fills only a minor portion of the container. The inner surface of the container 10, may also be provided with a coating 9 of smooth non-absorbant material which enhances the condensation of the liquid coolant 12 into suitable drops ensuring the return of the condensation to the liquid mass.

The supporting ring 5, to which the soft yieldable wall 2 and the edge of the container 10 is secured, forms a radially extending flange through which a plurality of circumferentially uniformly spaced apertures may be provided. In this manner the exterior of the cooling apparatus may be provided with means by which the soft yieldable surface may be secured in pressure contact against a face of the semi-conductor device 1. Tie rods 14 may be employed to connect a pair of coolant devices on either side of the semi-conductor or one semi-conductor with a retaining means provided on the opposite side of the semi-conductor. The tie rod 14 extends through a insulating member 6, for example, made of ceramic or plastic, which extends through the apertures formed in the circumference of the ring 5. A metal washer 7 may be used below the head of the tie rod for strength and support. The member 6 extends through the ring 5 and through the hole in the radial flanged edge of the soft yieldable wall 2 as well as covering the flanged edge of the container 10. In this way full electrical insulation of the tie rod from the yieldable wall 2 contacting the semi-conductor device as well as from the ring 5 and the container 10 can be obtained.

Preferably, the soft yieldable wall is of such an area that it covers the entire surface of the semi-conductor device 1 which it contacts. The porous member 3 is furthermore of such an area that it too is larger than the area of the contacting surface of the device 1 so that complete transference of heat from the entire surface of the semi-conductor device can be made via the soft yieldable wall and the porous member 3. It will be seen from FIG. 2 that a terminal 15 can be joined as for example by brazing or welding with the exposed surface of the soft yieldable wall portion 2 radially extending about the ring 5. This provides easy access and complete electrical conductivity through the highly conductive soft yieldable wall portion 2. While one terminal is shown on only the coolant apparatus shown in the right portion of FIG. 2, a similar terminal can be placed on the coolant apparatus shown on the left section of the Figure.

To enhance the stability of the porous member 3 and to prevent its movement within the container 10, its surface adjacent the soft yieldable wall 2 may be scratched or grooved providing greater traction. The liquid coolant 12 may be for example water, or similar easily vaporizable material. The semi-conductor devices used in either of the examples shown above may be conventional wafer type devices formed of semi-conductive material as for example silicon, and have PN-junctions formed therein. The wafer is preferably provided with associated supporting plates of a metal whose coefficient of thermal expansion approximates that of the semi-conductive material of the wafer. These metal plates provide the contact surfaces against which the soft yieldable wall portion of the coolant apparatus described make contact. Such metal plates may be made for example of tungsten or molybdenum.

The method of operating the apparatus embodying the cooling system of the present invention is as follows:

The apparatus of either FIG. 1 or FIG. 2 is secured in proper position against the facial surface of the semi-conductor device and is clamped by means of either the tie rods 14 or other clamping means so that the soft yieldable wall 2 is pressed against the surface with a sufficient force to provide a firm fixed and compressive abutment. The soft yieldable wall is so flexible that when compressed it can take on the contour of the surface of the semi-conductor device and be sufficiently rolled so as to completely cover its surface. The heat developed in the semi-conductor device is transferred by conduction through the soft yielding wall portion 2 directly to the coolant fluid in the chamber of the container 10 and particularly to the coolant fluid absorbed by the porous member 3. The coolant fluid is thus caused to vaporize, rises and expands within the chamber and then condenses on the inner walls of the chamber 10, which walls are cooled by the stream of coolant air passing through and about the fins 13. The coolant air may be ambient air or may be forced air produced by a fan or the like. The condensed liquid coolant is then returned to the mass of liquid coolant 12 which is then transferred via capillary action and/or direct flow due to the shape of the chamber 10 to the contact surfaces between the soft yieldable wall portion 2 and the porous member 3 to fill the area of the porous member vacated by the initial vaporization of the liquid coolant 12. The major area at which vaporization occurs is of course the interface between the yieldable wall portion 2 and the porous member 3 since at this contact surface the degree of latent heat is at its highest. In this way heat is transferred from a heat source, namely the semi-conductor device, to a heat output zone creating a vaporizable working medium which is then circulated through the chamber. The process remains in continuous cycle so long as the heat input zone is active.

The process may be improved by providing the surface of the porous member 3 adjacent the inner side of the soft yieldable wall portion 2 with scratches or grooves, which, in addition to the aforementioned advantage provides an increased absorbing surface in contact with the liquid medium and also an increased surface for capillary action. An increase of heat transfer from inside of the container 10 to the outer surface may be obtained by providing as indicated earlier, a coating of material enhancing the condensation of the vapor into drops for return to the liquid coolant mass. Preferably this inner coating extends over the entire inner wall of the container except for that portion formed by the soft yieldable wall portion 2.

Various modifications have been suggested and shown, other modifications, changes as well as embodiments will be obvious to those skilled in the present art. It is therefore intended that the present disclosure be taken as illustrative only of the present invention and not as limiting of its scope.

What is claimed is:

1. A method for cooling a semi-conductor device comprising the steps of subjecting the electrode face of said semi-conductor to contact with a yieldable wall of a container, placing a porous member within said container adjacent said yieldable wall and biasing said porous member against said yieldable wall, partially filling the container with a liquid medium in contact with said porous member and causing the heat of said electrode to be dissipated through said wall, said porous member and said liquid.

2. The method according to claim 1 including the step of placing a second container having a yieldable wall partition, a porous member and a liquid adjacent the opposite face of said semi-conductor.

3. The method according to claim 1 including the step of yieldably biasing said porous member against said wall.

* * * * *